(12) United States Patent
Jeong (10) Patent No.: US 8,797,808 B2
(45) Date of Patent: Aug. 5, 2014

(54) SEMICONDUCTOR DEVICE AND SEMICONDUCTOR MEMORY DEVICE

(75) Inventor: Jeongsu Jeong, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 161 days.

(21) Appl. No.: 13/483,590

(22) Filed: May 30, 2012

(65) Prior Publication Data

US 2013/0322183 A1    Dec. 5, 2013

(51) Int. Cl.
*G11C 7/10*    (2006.01)
*G11C 8/00*    (2006.01)
G11C 19/00    (2006.01)
G11C 11/4076    (2006.01)
G11C 7/22    (2006.01)

(52) U.S. Cl.
CPC ............... *G11C 8/00* (2013.01); *G11C 7/1078* (2013.01); *G11C 7/1087* (2013.01); *G11C 19/00* (2013.01); *G11C 11/4076* (2013.01); *G11C 7/1039* (2013.01); *G11C 7/222* (2013.01)
USPC .......... 365/189.05; 365/189.011; 365/189.02; 365/189.17; 365/189.12; 365/191; 365/230.01; 365/230.06; 365/230.09; 365/233.1; 365/236; 365/239

(58) Field of Classification Search
CPC .... G11C 7/1078; G11C 7/1087; G11C 19/00; G11C 11/4076; G11C 7/1039; G11C 7/222; G11C 8/00
USPC ........... 365/189.05, 189.011, 189.02, 189.17, 365/189.12, 191, 230.01, 230.06, 230.09, 365/233.1, 236, 239, 96
See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,904,751 B2 | 6/2005 | Makki et al. | |
| 7,173,851 B1 | 2/2007 | Callahan et al. | |
| 7,269,047 B1 | 9/2007 | Fong et al. | |
| 2012/0092947 A1* | 4/2012 | Kim et al. .................. | 365/225.7 |

* cited by examiner

*Primary Examiner* — Fernando Hidalgo
(74) *Attorney, Agent, or Firm* — IP & T Group LLP (57) ABSTRACT

A semiconductor device includes: a non-volatile memory unit; a data bus configured to transfer data outputted from the non-volatile memory unit; a selection signal generation unit configured to generate a plurality of selection signals based on a clock; and a plurality of latch sets configured to each be enabled in response to a selection signal that corresponds to the latch set among the selection signals and store the data transferred through the data bus.

16 Claims, 8 Drawing Sheets

SEMICONDUCTOR DEVICE AND SEMICONDUCTOR MEMORY DEVICE

BACKGROUND

1. Field

Exemplary embodiments of the present invention relate to a semiconductor device, and more particularly, to a technology for transferring data stored in a non-volatile memory device of a semiconductor device to other constituent elements of the semiconductor device.

2. Description of the Related Art

Figure 1:
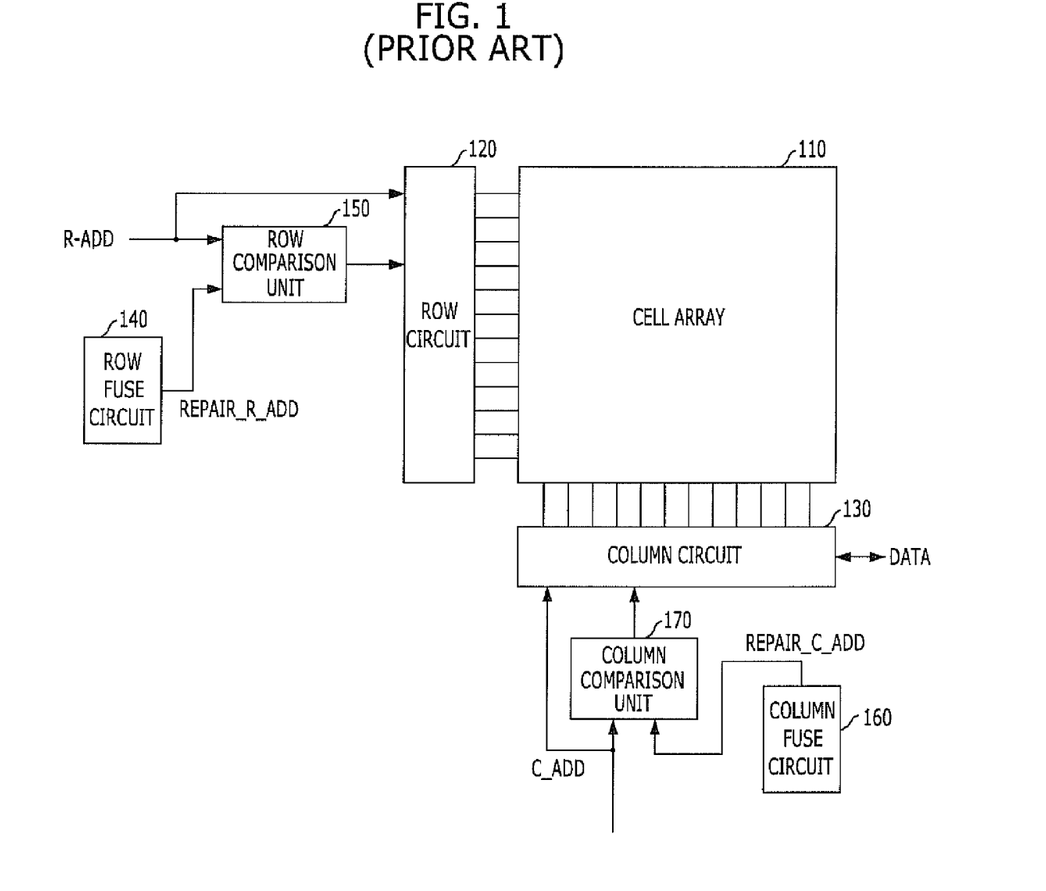
FIG. 1 is a block view illustrating a repair operation of a conventional memory device.

FIG. 1 is a block view illustrating a repair operation of a conventional memory device.

Referring to FIG. 1, the memory device includes a cell array 110, a row circuit 120, and a column circuit 130. The cell array 110 includes a plurality of memory cells. The row circuit 120 enables a word line selected based on a row address R_ADD. The column circuit 130 accesses, that is, 'reads' or 'writes', the data of a bit line selected based on a column address C_ADD.

A row fuse circuit 140 stores a row address corresponding to a failure memory cell of the cell array 110 by a repair row address REPAIR_R_ADD. A row comparison unit 150 compares the repair row address REPAIR_R_ADD stored in the row fuse circuit 140 with the row address R_ADD inputted from the outside of the memory device. If the repair row address REPAIR_R_ADD and the row address R_ADD are the same, the row comparison unit 150 controls the row circuit 120 to enable a redundancy word line instead of the word line designated by the row address R_ADD.

A column fuse circuit 160 stores a column address corresponding to a failure memory cell of the cell array 110 by a repair column address REPAIR_C_ADD. A column comparison unit 170 compares the repair column address REPAIR_C_ADD stored in the column fuse circuit 160 with the column address C_ADD inputted from the outside of the memory device. If the repair column address REPAIR_C_ADD and the column address C_ADD are the same, the column comparison unit 170 controls the column circuit 130 to enable a redundancy bit line instead of the bit line designated by the column address C_ADD.

The row fuse circuit 140 and the column fuse circuit 160 shown in FIG. 1 use a laser fuse. The laser fuse stores a data of a logic high level or a logic low level according to whether the fuse is cut or not. The laser fuse may be programmed in the stage of forming wafer, but after the wafer is mounted on a package, the laser fuse cannot be programmed. To address such a feature, an e-fuse is used, where the e-fuse is formed of a transistor and stores a data by changing the resistance between a gate and a drain/source.

Figure 2:
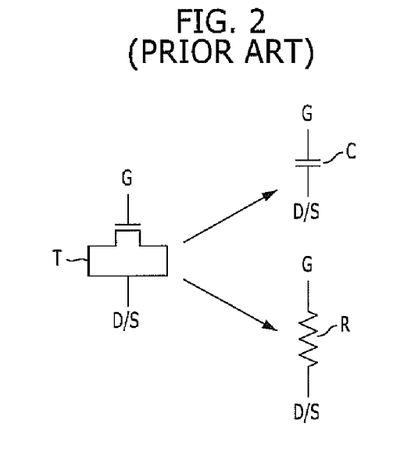
FIG. 2 illustrates an e-fuse formed of a transistor operating as a resistor or a capacitor.

FIG. 2 illustrates an e-fuse formed of a transistor operating as a resistor or a capacitor.

Referring to FIG. 2, the e-fuse is formed of a transistor T, and when a power source voltage of an ordinary level that the transistor T may endure is applied to a gate G, the e-fuse operates as a capacitor C. Therefore, no current flows between the gate G and the drain D or source S. On the other hand, when a power source voltage of a high level that the transistor T may not endure is applied to a gate G, the gate oxide of the transistor T is destroyed and the gate G and the drain D-source S is shorted and the e-fuse operates as a resistor R. Therefore, current comes to flow between the gate G and the drain D-source S.

The data of the e-fuse is recognized from the resistance between the gate G and the drain D-source S of the e-fuse based on the above-described phenomenon. In detecting the data of the e-fuse, (1) the data may be directly recognized without performing an additional sensing operation by using a large size transistor for the transistor T or (2) the data of the e-fuse may be recognized by using an amplifier to sense the current flowing through the transistor T instead of reducing the size of the transistor T. In using either method, substantial space is used in that the size of the transistor T used for the e-fuse is to be large or an amplifier for amplifying the data for each e-fuse is to be used.

Due to the large space used in implementing methods, it is not easy to apply the e-fuse to the row fuse circuit 140 and the column fuse circuit 160 shown in FIG. 1. To address such features, U.S. Pat. Nos. 6,904,751, 6,777,757, 6,667,902, 7,173,851, and 7,269,047 discloses a method of forming e-fuses in the form of an array and performing a repair operation by using the data stored in the e-fuse array. When the e-fuses are formed as an array, the total area may be reduced because amplifiers may be shared by the e-fuses.

SUMMARY

An embodiment of the present invention is directed to a semiconductor device that includes a non-volatile memory device, such as an e-fuse array and may transfer the data stored in an e-fuse array to other constituent elements of the semiconductor device that use the data of the e-fuse array in order to have the data stored in the e-fuse array, such as diverse setup information and repair information.

Another embodiment of the present invention is directed to a scheme for transferring the data stored in the e-fuse array to other constituent elements of the semiconductor device in the semiconductor device.

In accordance with an embodiment of the present invention, a semiconductor device includes: a non-volatile memory unit; a data bus configured to transfer data outputted from the non-volatile memory unit; a selection signal generation unit configured to generate a plurality of selection signals based on a clock; and a plurality of latch sets configured to each be enabled in response to a selection signal that corresponds to the latch set among the selection signals and store the data transferred through the data bus.

In accordance with another embodiment of the present invention, a semiconductor device includes: a non-volatile memory unit; a data bus configured to transfer data that are outputted from the non-volatile memory unit; a first selection signal generation unit configured to sequentially enable a plurality of first selection signals in response to a first clock; a plurality of first latch sets configured to each be enabled in response to a first selection signal that corresponds to the first latch set among the first selection signals and store the data transferred through the data bus; a clock transfer unit configured to transfer the first clock as a second clock after each one of the first selection signals is enabled; a second selection signal generation unit configured to sequentially enable a plurality of second selection signals in response to the second clock; and a plurality of second latch sets configured to each be enabled in response to a second selection signal that corresponds to the second latch set among the multiple second selection signals and store the data transferred through the data bus.

In accordance with yet another embodiment of the present invention, a semiconductor memory device includes: a non-volatile memory unit configured to store repair data; a data bus configured to transfer data outputted from the non-volatile memory unit; a first selection signal generation unit configured to sequentially enable a plurality of first selection signals in response to a first clock; a plurality of first latch sets configured to each be enabled in response to a first selection signal that corresponds to the first latch set among the first selection signals and store the data transferred through the data bus; a first memory bank configured to replace a normal memory cell with a redundancy memory cell based on the data stored in the first latch sets; a clock transfer unit configured to transfer the first clock as a second clock after each one of the first selection signals is enabled; a second selection signal generation unit configured to sequentially enable a plurality of second selection signals based on the second clock; a plurality of second latch sets configured to each be enabled in response to a second selection signal that corresponds to the second latch set among the multiple second selection signals and store the data transferred through the data bus; and a second memory bank configured to substitute a normal memory cell with a redundancy memory cell based on the data stored in the second latch sets.

In accordance with still another embodiment of the present invention, a semiconductor memory device includes: a non-volatile memory unit configured to store repair data; a data bus configured to transfer data outputted from the non-volatile memory unit; a first selection signal generation unit configured to sequentially enable a plurality of first selection signals in response to a first dock; a plurality of first latch sets configured to each be enabled in response to a first selection signal that corresponds to the first latch set among the first selection signals and store the data transferred through the data bus; a plurality of second latch sets configured to each be enabled in response to a first selection signal that corresponds to the second latch set among the multiple first selection signals and store the data transferred through the data bus; a first memory bank configured to replace a normal memory cell with a redundancy memory cell based on the data stored in the first latch sets; a second memory bank configured to replace a normal memory cell with a redundancy memory cell based on the data stored in the second latch sets; a clock transfer unit configured to transfer the first clock as a second clock after each of the multiple first selection signals is enabled; a second selection signal generation unit configured to sequentially enable a plurality of second selection signals in response to the second clock; a plurality of third latch sets to each be enabled in response to a second selection signal that corresponds to the third latch set among the multiple second selection signals and store the data transferred through the data bus; a plurality of fourth latch sets configured to each be enabled in response to a second selection signal that corresponds to the fourth latch set among the multiple second selection signals and store the data transferred through the data bus; a third memory bank configured to replace a normal memory cell with a redundancy memory cell based on the data stored in the third latch sets; and a fourth memory bank configured to replace a normal memory cell with a redundancy memory cell based on the data stored in the fourth latch sets.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
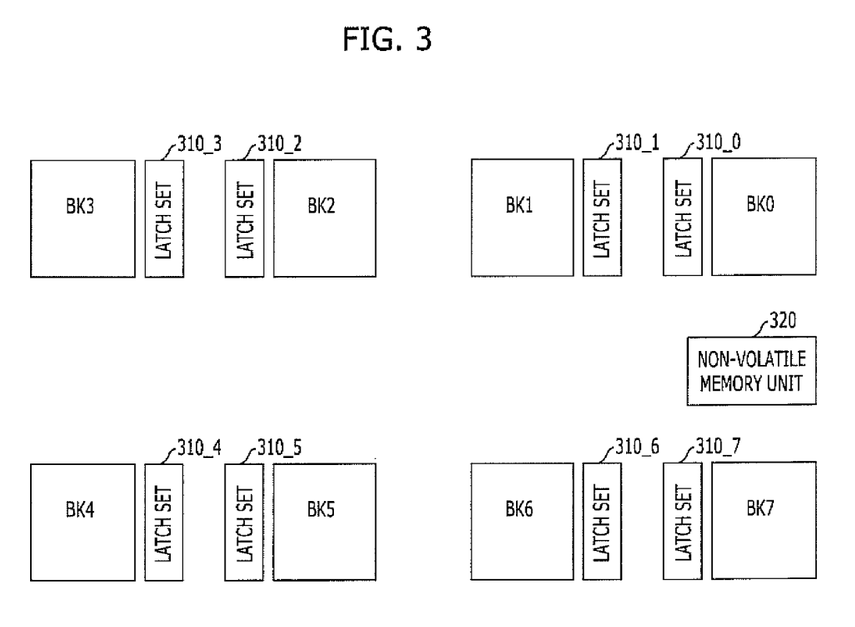
FIG. 3 illustrates a non-volatile memory unit for storing repair information in a semiconductor memory device.

FIG. 3 illustrates a non-volatile memory unit for storing repair information in a semiconductor memory device in accordance with an embodiment of the present invention.

Referring to FIG. 3, the semiconductor memory device includes a plurality of memory banks BK0 to BK7, latch sets 310_0 to 310_7, and the non-volatile memory unit 320. Each of the latch sets 310_0 to 310_7 is provided for each memory bank and stores a repair address.

The non-volatile memory unit 320 replaces conventional fuse circuits, such as the row fuse circuit 140 and the column fuse circuit 160 shown in FIG. 1. The non-volatile memory unit 320 stores repair information corresponding to all of the memory banks BK0 to BK7, which include repair addresses. The non-volatile memory unit 320 may be formed to include an e-fuse array or it may be formed of a non-volatile memory device, such as a flash memory device and an Electrically Erasable Programmable Read-Only Memory (EEPROM) device.

The latch sets 310_0 to 310_7 are respectively mounted on the memory banks BK0 to BK7 and store the repair information of a corresponding memory bank BK0 to BK7. A first latch set 310_0 stores the repair information of a first memory bank BK0, and a fifth latch set 310_4 stores the repair information of a fifth memory bank BK4. The latch sets 310_0 to 310_7 receive and store the repair information from the non-volatile memory unit 320 during the initialization operation of the semiconductor memory device.

Since the non-volatile memory unit 320 is formed in a type of an array, it takes some time to call the data stored in the non-volatile memory unit 320. Therefore, it is difficult to perform a repair operation by directly using the data stored in the non-volatile memory unit 320. For this reason, the data stored in the non-volatile memory unit 320 are transferred to the latch sets 310_0 to 310_7, and the data stored in the latch sets 310_0 to 310_7 are used for a repair operation.

For the data to be transferred from the non-volatile memory unit 320 to the latch sets 310_0 to 310_7, the addresses for designating the corresponding latch sets in which the data are to be stored among the multiple latch sets 310_0 to 310_7 have to be transferred along with the data to be stored in the latch sets 310_0 to 310_7. Hereafter, a scheme for transferring the data in accordance with an embodiment of the present invention is described.

Figure 4:
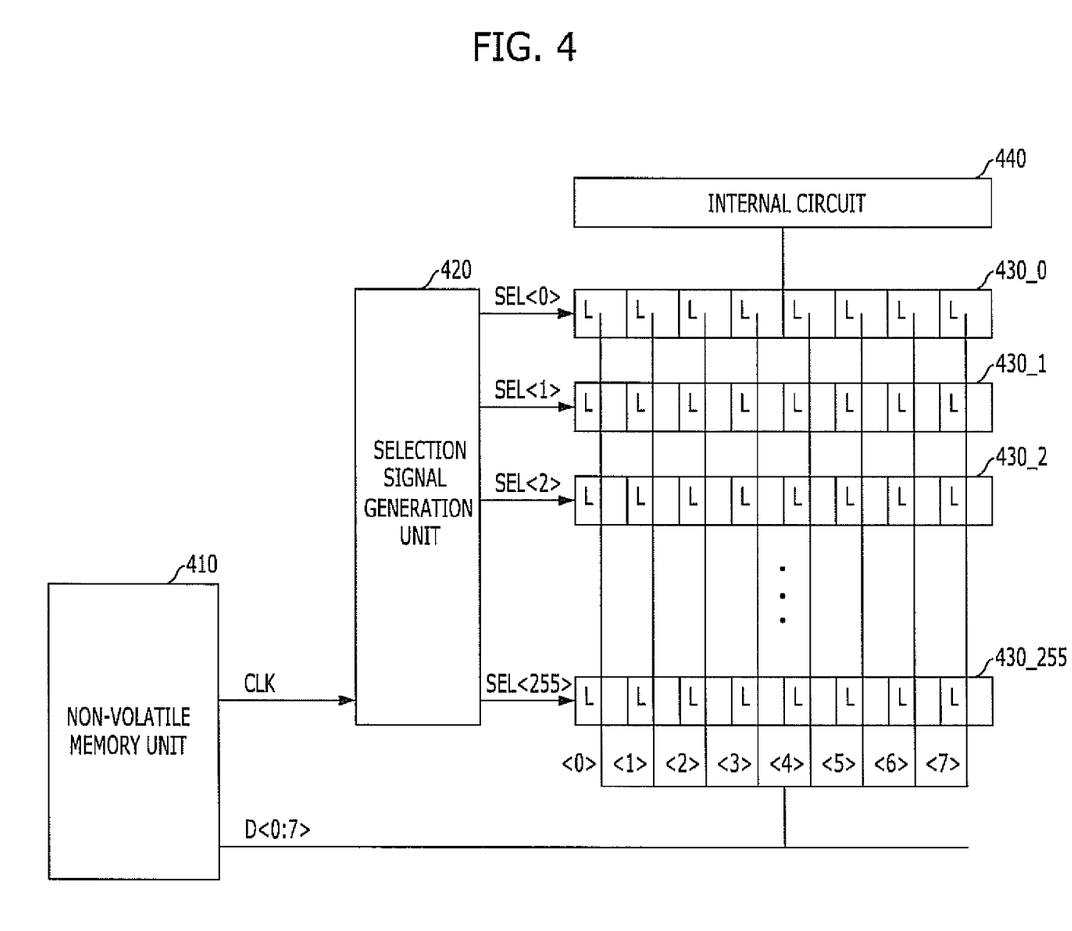
FIG. 4 is a block view of a semiconductor device in accordance with an embodiment of the present invention.

FIG. 4 is a block view of a semiconductor device in accordance with an embodiment of the present invention.

Referring to FIG. 4, the semiconductor device includes a non-volatile memory unit 410, a selection signal generation unit 420, a plurality of latch sets 430_0 to 430_255, and an internal circuit 440 that uses the information stored in the latch sets 430_0 to 430_255.

The non-volatile memory unit 410 stores the data to be transferred to the latch sets 430_0 to 430_255. The data are transferred from the non-volatile memory unit 410 to the latch sets 430_0 to 430_255 through a data bus D<0:7>. In this embodiment, a data bus of 8 bits is taken as an example. A clock CLK is outputted from the non-volatile memory unit 410. The clock CLK is synchronized with the data of the data bus D<0:7>. The non-volatile memory unit 410 may be formed to include an e-fuse array or it may be formed of a non-volatile memory device, such as a flash memory device and an Electrically Erasable Programmable Read-Only Memory (EEPROM) device.

The selection signal generation unit 420 generates a plurality of selection signals SEL<0:255> based on the clock CLK. More specifically, the selection signal generation unit 420 sequentially enables the selection signals SEL<0:255> sequentially one by one whenever the clock CLK is enabled. For example, when the clock CLK is enabled for the first time, a selection signal SEL<0> is enabled, and when the clock CLK is enabled for the second time, a selection signal SEL<1> is enabled.

Each of the latch sets 430_0 to 430_255 includes a number of latches equal to the number of the bits of the data bus D<0:7>, that is, 8 latches in this embodiment of the present invention. Each of the latch sets 430_0 to 430_255 is enabled by a selection signal SEL<0:255> that corresponds to the latch set, and the enabled latch set receives and stores the data of the data bus D<0:7>. For example, when a selection signal SEL<1> is enabled, a latch set 430_1 receives and stores the data of the data bus D<0:7>. When a selection signal SEL<255> is enabled, a latch set 430_255 receives and stores the data of the data bus D<0:7>.

The internal circuit 440 is a circuit that uses the data stored in the latch sets 430_0 to 430_255 for performing internal operations of the semiconductor device. For example, the internal circuit 440 may be a circuit for performing a special operation using the data stored in the latch sets 430_0 to 430_255. Also, if the semiconductor device is a memory device, the internal circuit 440 may be a circuit that performs a repair operation by using the data stored in the latch sets 430_0 to 430_255, which is repair information in this case.

Referring to FIG. 4, when the data of the non-volatile memory unit 410 are transferred to the latch sets 430_0 to 430_255, the clock CLK is transferred instead of an address, and the selection signal generation unit 420 designates a latch set in which the data of the data bus D<0:7> are to be stored among the latch sets 430_0 to 430_255. Therefore, it does not need to transfer a multi-bit address from the non-volatile memory unit 410 to the latch sets 430_0 to 430_255, which leads to a significant decrease in the area of the semiconductor device.

Figure 5:
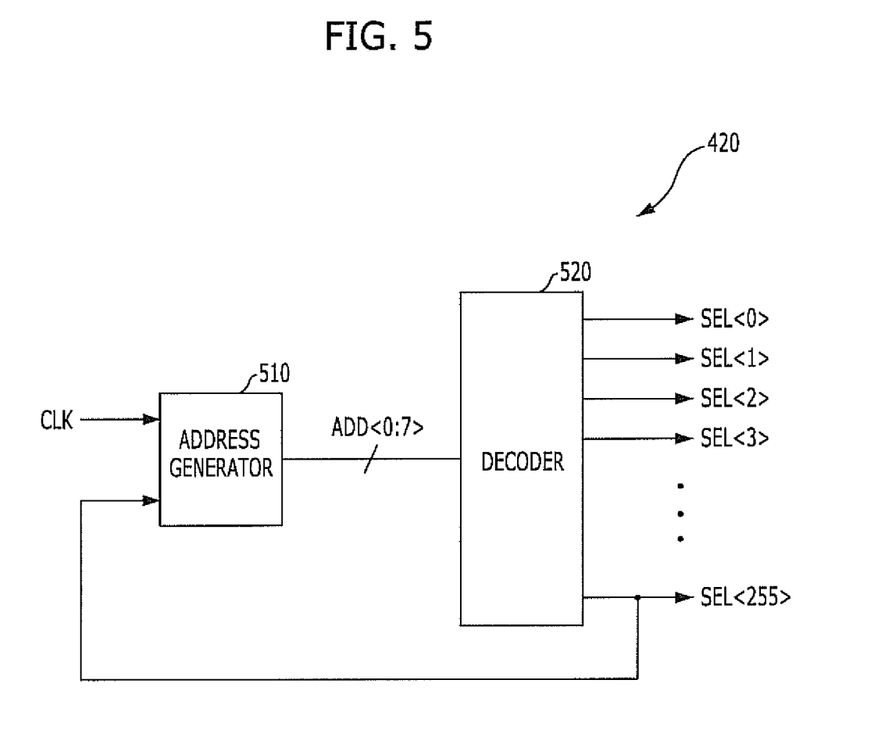
FIG. 5 is a block view illustrating a selection signal generation unit 420 shown in FIG. 4.

FIG. 5 is a block view illustrating the selection signal generation unit 420 shown in FIG. 4.

Referring to FIG. 5, the selection signal generation unit 420 includes an address generator 510 and a decoder 520.

The address generator 510 generates an address ADD<0:7> by counting the clock CLK. Since FIG. 4 illustrates that the number of the selection signals SEL<0:255> is 256, it is exemplarily illustrated herein that the address ADD<0:7> is an 8-bit binary code. The address generator 510 may be designed using a counter.

The decoder 520 generates the selection signals SEL<0:255> by decoding the address ADD<0:7>. Since the address ADD<0:7> is an 8-bit binary code, when the address ADD<0:7> is decoded, any one among the 256 selection signals SEL<0:255> may be enabled.

When the last selection signal SEL<255> is enabled, data has been stored in all latch sets 430_0 to 430_255, and the address generator 510 and the decoder 520 are subsequently disabled in response to the enabling of the last selection signal SEL<255> so that all the selection signals SEL<0:255> are subsequently maintained in the disabled state.

Figure 6:
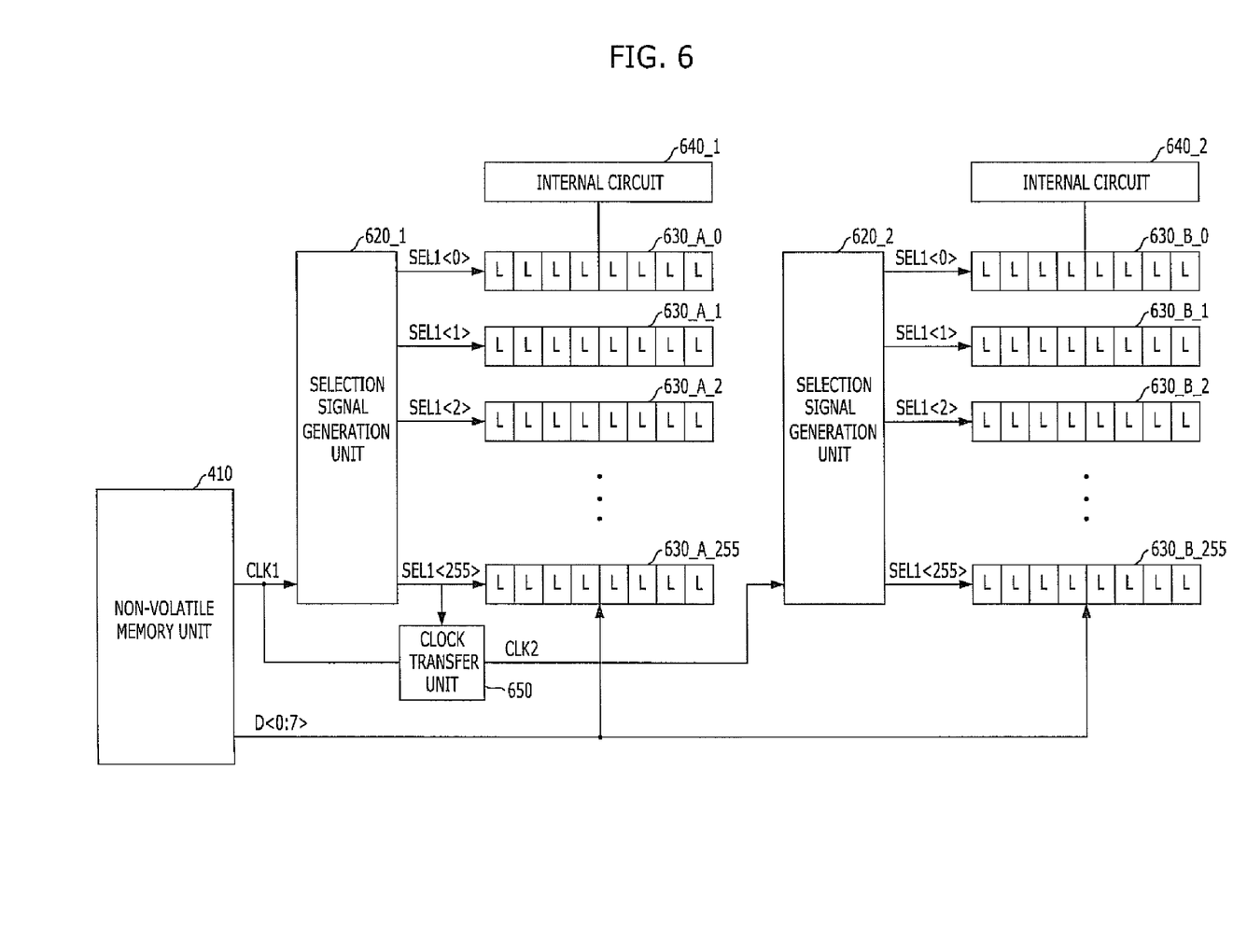
FIG. 6 is a block view of a semiconductor device in accordance with another embodiment of the present invention.

FIG. 6 is a block view of a semiconductor device in accordance with another embodiment of the present invention.

FIG. 6 illustrates an embodiment of a case where the data stored in the non-volatile memory unit 410 of the semiconductor device are transferred to other constituent elements of the semiconductor device. Referring to FIG. 6, the semiconductor device includes a non-volatile memory unit 410, a first selection signal generation unit 620_1, a plurality of first latch sets 630_A_0 to 630_A_255, a clock transfer unit 650, a second selection signal generation unit 620_2, and a plurality of second latch sets 630_B_0 to 630_B_255, a first internal circuit 640_1 for using the information stored in the first latch sets 630_A_0 to 630_A_255, and a second internal circuit 640_2 for using the information stored in the second latch sets 630_B_0 to 630_B_255.

The non-volatile memory unit 410 stores data to be transferred to the first latch sets 630_A_0 to 630_A_255 and the second latch sets 630_B_0 to 630_B_255. The non-volatile memory unit 410 transfers the data through a data bus D<0:7>. The non-volatile memory unit 410 outputs a first clock CLK1 and the first clock CLK1 is synchronized with the data of the data bus D<0:7>.

The first selection signal generation unit 620_1 generates a plurality of first selection signals SEL1<0:255> based on the first clock CLK1. The first selection signal generation unit 620_1 may be formed the same as the selection signal generation unit 420 that is shown in FIGS. 4 and 5.

Each of the first latch sets 630_A_0 to 630_A_255 includes a number of latches equal to the number of the bits of the data bus D<0:7>. Each of the first latch sets 630_A_0 to 630_A_255 is enabled by a first selection signals SEL1<0:255> that corresponds to the first latch set, and the enabled first latch set receives and stores the data of the data bus D<0:7>.

The first internal circuit 640_1 uses the information stored in the first latch sets 630_A_0 to 630_A_255.

The clock transfer unit 650 transfers the first clock CLK1 as a second clock CLK2 after all of the first selection signals SEL1<0:255> are enabled. The lastly enabled first selection signal SEL1<255> among the multiple first selection signals SEL1<0:255> informs the clock transfer unit 650 that each of the first selection signals SEL1<0:255> have been enabled. Here, before the last one of the first selection signals SEL1<255> is enabled, the clock transfer unit 650 maintains the level of the second clock CLK2 at a logic low level.

The second selection signal generation unit 620_2 generates a plurality of second selection signals SEL2<0:255> based on the second clock CLK2 and in response to a detection by the clock transfer unit 650 lastly enabled first selection signal SEL1<255>. The second selection signal generation unit 620_2 may be formed the same as the selection signal generation unit 420 that is shown in FIGS. 4 and 5.

Each of the second latch sets 630_B_0 to 630_B_255 includes a number of latches equal to the number of the bits of the data bus D<0:7>. Each of the first latch sets 630A0 to 630_A_255 is enabled by a second selection signals SEL2<0:

255> that corresponds to the second latch set, and the enabled second latch set receives and stores the data of the data bus D<0:7>.

The second internal circuit 640_2 uses the information stored in the second latch sets 630B0 to 630_B_255.

Referring to FIG. 6, when the data of the non-volatile memory unit 410 are transferred to the first latch sets 630_A_0 to 630_A_255 and the second latch sets 630_B_0 to 630_B_255, the first clock CLK1 is transferred instead of an address. Also, since the clock transfer unit 650 decides the moment when the first clock CLK1 is transferred to the second selection signal generation unit 620_2, the data may be efficiently transferred to other constituent elements of the semiconductor device.

Figure 7:
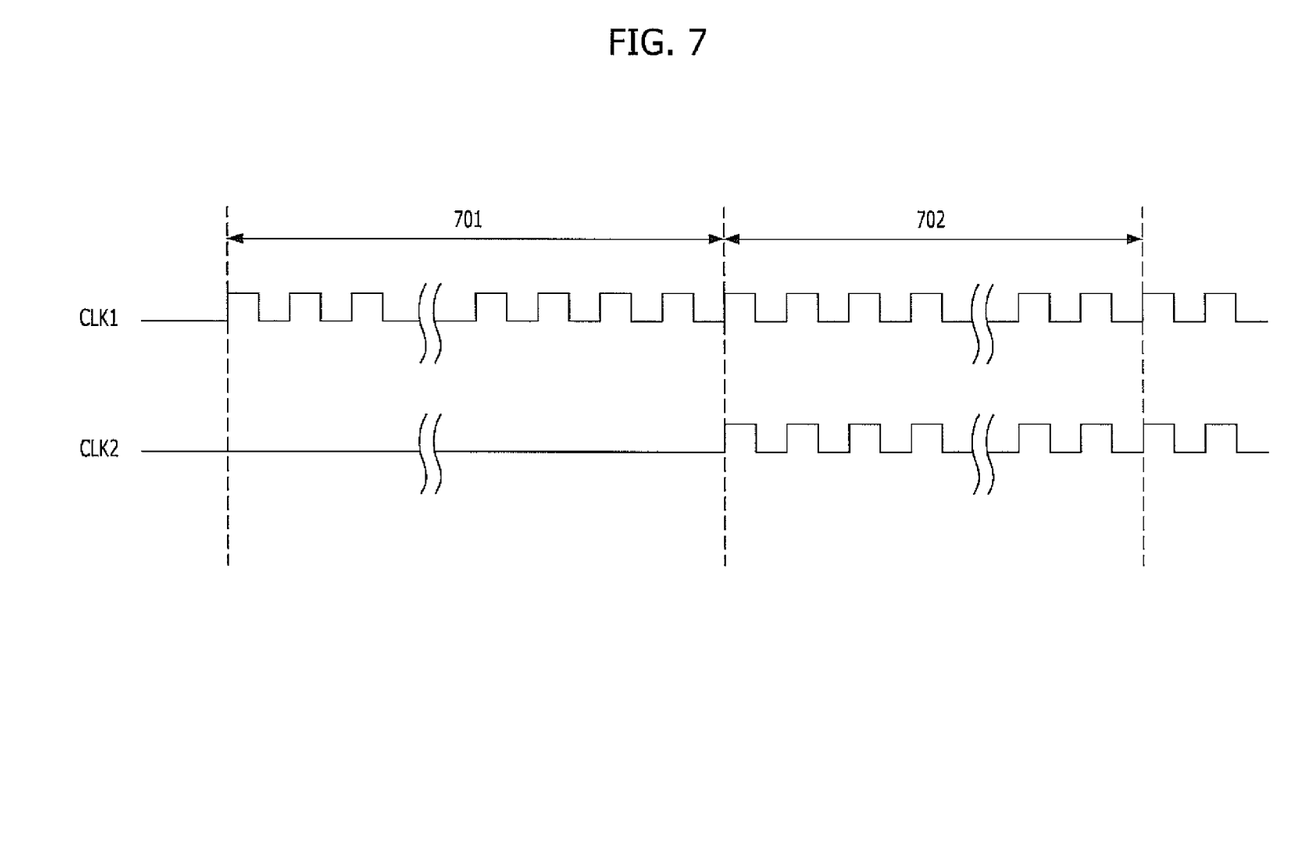
FIG. 7 illustrates the operation of a clock transfer unit 650 shown in FIG. 6.

FIG. 7 illustrates the operation of the clock transfer unit 650 shown in FIG. 6.

Referring to FIG. 7, the first clock CLK1 toggles as soon as data is outputted from the non-volatile memory unit 410. In a first duration 701 during which the first clock CLK1 is enabled 256 times, the data outputted from the non-volatile memory unit 410 are stored in the first latch sets 630_A_0 to 630_A_255. After the first duration 701, the clock transfer unit 650 transfers the first clock CLK1 as the second clock CLK2. As described before, the clock transfer unit 650 is informed of the termination of the first duration 701 from the lastly enabled first selection signal SEL1<255>. In a second duration 702 where the second clock CLK2 is enabled 256 times, the data outputted from the non-volatile memory unit 410 are stored in the multiple second latch sets 630_B_0 to 630_B_255.

After the first duration 701, since the first selection signal generation unit 620_1 is disabled and the second selection signal generation unit 620_2 is disabled after the second duration 702, the data are not repeatedly stored in the multiple first latch sets 630_A_0 to 630_A_255 and the multiple second latch sets 630_B_0 to 630_B_255.

Figure 8:
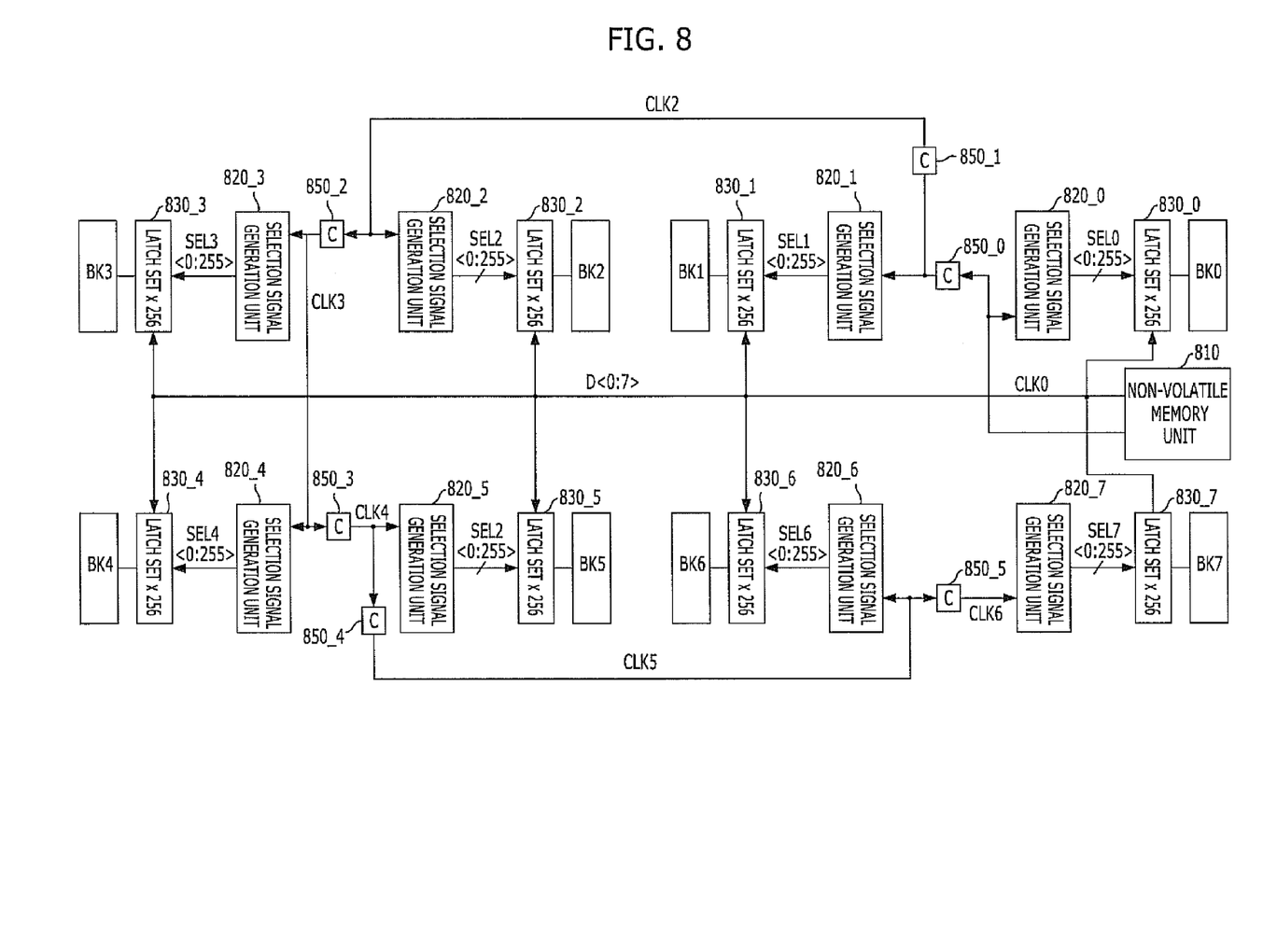
FIG. 8 is a block view of a memory device in accordance with an embodiment of the present invention.

FIG. 8 is a block view of a memory device in accordance with an embodiment of the present invention. Referring to FIG. 8, the memory device includes a non-volatile memory unit 810, memory banks BK0 to BK7, selection signal generation units 820_0 to 820_7 that are respectively included by the memory banks BK0 to BK7, a plurality of latch sets 830_0 to 830_7 that are respectively included in the memory banks BK0 to BK7, and a plurality of clock transfer units 850_0 to 850_6.

The non-volatile memory unit 810 stores repair data of the memory banks BK0 to BK7, that is, the addresses of failure cells. The non-volatile memory unit 810 transfers data through a data bus D<0:7>. A clock CLK0 is outputted from the non-volatile memory unit 810. The clock CLK0 is synchronized with the data of the data bus D<0:7>. The non-volatile memory unit 810 may be formed to include an e-fuse array, or it may be formed of a non-volatile memory device, such as a flash memory device and an Electrically Erasable Programmable Read-Only Memory (EEPROM) device.

Each of the selection signal generation units 820_0 to 820_7 generates selection signals SEL0<0:255> to SEL7<0:255> based on a clock CLK0 to CLK7 that is inputted to the selection signal generation unit. Each of the selection signal generation units 820_0 to 820_7 may be formed the same as the selection signal generation unit 420 described with reference to FIGS. 4 and 5.

Each of the latch sets 830_0 to 830_7 includes 256 latches for each of the memory banks BK0 to BK7. Each of the latch sets 830_0 to 830_7 is enabled by a selection signal SEL0<0: 255> to SEL7<0:255> that corresponds to the latch set, and the enabled latch set receives and stores the data of the data bus D<0:7>.

The clock transfer units, 850_0 to 850_6 transfers an input clock as an output clock after the clock inputted thereto is enabled 256 times. For example, a fourth clock transfer unit 850_3 transfers a clock CLK3 as a clock CLK4 after the clock CLK3 is enabled 256 times.

The memory banks BK0 to BK7 perform a repair operation based on repair data that are stored in the corresponding latch sets 830_0 to 830_7. Each of the memory banks BK0 to BK7 may be formed of a Dynamic Random Access Memory (DRAM) cell array or a flash cell array.

Referring to FIG. 8, the repair information of all the memory banks BK0 to BK7 of the memory device is stored in the non-volatile memory unit 810, and the repair information stored in the non-volatile memory unit 810 is efficiently transferred to the latch sets 830_0 to 830_7 that are respectively included in the memory banks BK0 to BK7.

The repair information stored in the latch sets 830_0 to 830_7 may be row repair information or column repair information. Also, the repair informations stored in the latch sets 830_0 to 830_7 may include both row repair information and column repair information.

Figure 9:
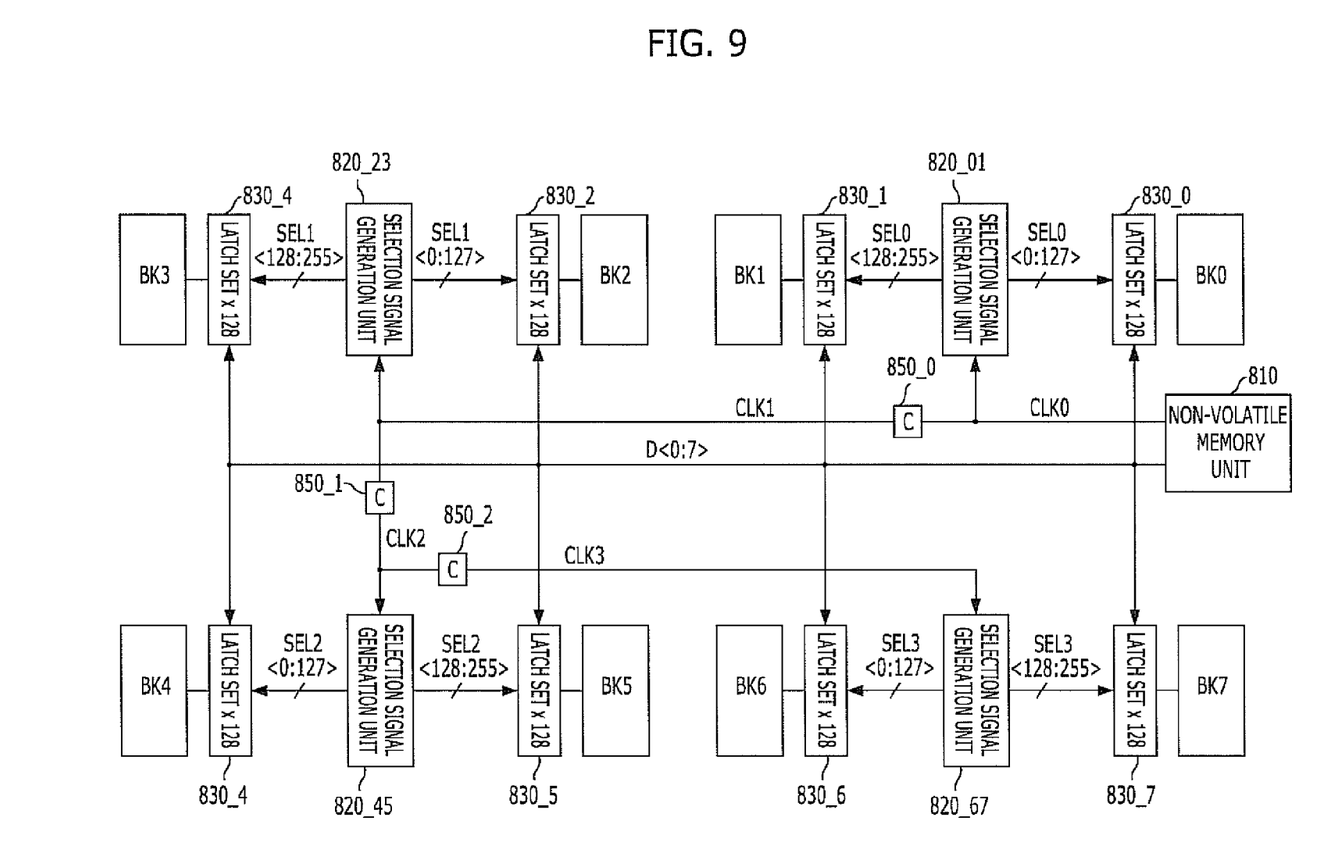
FIG. 9 is a block view of a memory device in accordance with another embodiment of the present invention.

FIG. 9 is a block view of a memory device in accordance with another embodiment of the present invention.

FIG. 9 illustrates an embodiment of a case where two memory banks share one selection signal generation unit. Referring to FIG. 9, a memory device includes a non-volatile memory unit 810 is shown, and memory banks BK0 to BK7, selection signal generation units 820_01, 820_23, 820_45 and 820_67 are each provided for every two memory banks, and clock transfer units 850_0 to 850_2, where a plurality of latch sets 830_0 to 830_7 are respectively included in the memory banks BK0 to BK7.

The memory device in accordance with the embodiment of FIG. 9 has the same structure and operation as the memory device in accordance with the embodiment of FIG. 8, except that the selection signal generation units 820_01, 820_23, 820_45 and 820_67 are shared by the latch sets that correspond to two memory banks. Thus, further description on the structure and operation of the memory device in accordance with the embodiment of FIG. 9 is omitted herein.

According to an embodiment of the present invention, data are efficiently transferred from a non-volatile memory unit internally within a semiconductor device to other circuits in the semiconductor device that use the data of the non-volatile memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
 a non-volatile memory unit;
 a data bus configured to transfer data outputted from the non-volatile memory unit;
 a selection signal generation unit configured to generate a plurality of selection signals based on a clock;
 a plurality of latch sets configured to each be enabled in response to a selection signal that corresponds to the latch set among the selection signals and store the data transferred through the data bus; and
 a clock transfer unit configured to receive and transfer the clock upon a detection that the transferred data has been stored in each of the plurality of latch sets sequentially.

2. The semiconductor device of claim 1, wherein the selection signal generation unit is configured to selectively enable a different one of the selection signals whenever the clock is enabled.

3. The semiconductor device of claim 2, wherein the selection signal generation unit is configured to be disabled after storing the data in every one of the latch sets.

4. The semiconductor device of claim 1, wherein the selection signal generation unit comprises:
an address generator for generating an address by counting the clock; and
a decoder for generating the selection signals by decoding the address.

5. The semiconductor device of claim 1, wherein the clock is synchronized with the data transferred through the data bus.

6. The semiconductor device of claim 1, wherein the non-volatile memory unit comprises an e-fuse array.

7. The semiconductor device of claim 1, wherein the selection signal generation unit is configured to enable each one of the selection signals sequentially so that the plurality of latch sets each store the data sequentially.

8. A semiconductor device, comprising:
a non-volatile memory unit;
a data bus configured to transfer data outputted from the non-volatile memory unit;
a first selection signal generation unit configured to sequentially enable a plurality of first selection signals in response to a first clock;
a plurality of first latch sets configured to each be enabled in response to a first selection signal that corresponds to the first latch set among the first selection signals and store the data transferred through the data bus;
a clock transfer unit configured to transfer the first clock as a second clock after each one of the first selection signals is enabled;
a second selection signal generation unit configured to sequentially enable a plurality of second selection signals in response to the second clock; and
a plurality of second latch sets configured to each be enabled in response to a second selection signal that corresponds to the second latch set among the multiple second selection signals and store the data transferred through the data bus.

9. The semiconductor device of claim 8, wherein the clock transfer unit is configured to maintain the second clock in a disabled state before the first clock is transferred as the second clock.

10. The semiconductor device of claim 8, wherein the first selection signal generation unit comprises:
a first address generator for generating a first address by counting the first clock; and
a first decoder for generating the first selection signals by decoding the first address, and the second selection signal generation unit comprises:
a second address generator for generating a second address by counting the second clock; and
a second decoder for generating the second selection signals by decoding the second address.

11. The semiconductor device of claim 8, wherein the first selection signal generation unit is configured to be disabled after the data is stored in each of the first latch sets, and
the second selection signal generation unit is configured to be disabled after the data is stored in each of the second latch sets.

12. The semiconductor device of claim 8, wherein the first clock is synchronized with the data transferred through the data bus.

13. The semiconductor device of claim 1, wherein the clock transfer unit is configured to receive and transfer the first clock as the second clock upon a detection that the transferred data has been stored in each of the first latch sets sequentially.

14. A semiconductor memory device, comprising:
a non-volatile memory unit configured to store repair data;
a data bus configured to transfer the data outputted from the non-volatile memory unit;
a first selection signal generation unit configured to sequentially enable a plurality of first selection signals in response to a first clock;
a plurality of first latch sets configured to each be enabled in response to a first selection signal that corresponds to the first latch set among the first selection signals and store the data transferred through the data bus;
a first memory bank configured to replace a normal memory cell with a redundancy memory cell based on the data stored in the first latch sets;
a clock transfer unit configured to transfer the first clock as a second clock after each one of the first selection signals is enabled;
a second selection signal generation unit configured to sequentially enable a plurality of second selection signals based on the second clock;
a plurality of second latch sets configured to each be enabled in response to a second selection signal that corresponds to the second latch set among the multiple second selection signals and store the data transferred through the data bus; and
a second memory bank configured to substitute a normal memory cell with a redundancy memory cell based on the data stored in the second latch sets.

15. The semiconductor memory device of claim 14, wherein the non-volatile memory unit comprises an e-fuse array, and
each of the first memory bank and the second memory bank comprises a Dynamic Random Access Memory (DRAM) cell array.

16. A semiconductor memory device, comprising:
a non-volatile memory unit configured to store repair data;
a data bus configured to transfer the data outputted from the non-volatile memory unit;
a first selection signal generation unit configured to sequentially enable a plurality of first selection signals in response to a first clock;
a plurality of first latch sets configured to each be enabled in response to a first selection signal that corresponds to the first latch set among the first selection signals and store the data transferred through the data bus;
a plurality of second latch sets configured to each be enabled in response to a first selection signal that corresponds to the second latch set among the multiple first selection signals and store the data transferred through the data bus;
a first memory bank configured to replace a normal memory cell with a redundancy memory cell based on the data stored in the first latch sets;
a second memory bank configured to replace a normal memory cell with a redundancy memory cell based on the data stored in the second latch sets;
a clock transfer unit configured to transfer the first clock as a second clock after each of the multiple first selection signals is enabled;
a second selection signal generation unit configured to sequentially enable a plurality of second selection signals in response to the second clock;

a plurality of third latch sets to each be enabled in response to a second selection signal that corresponds to the third latch set among the multiple second selection signals and store the data transferred through the data bus;

a plurality of fourth latch sets configured to each be enabled in response to a second selection signal that corresponds to the fourth latch set among the multiple second selection signals and store the data transferred through the data bus;

a third memory bank configured to replace a normal memory cell with a redundancy memory cell based on the data stored in the third latch sets; and a fourth memory bank configured to replace a normal memory cell with a redundancy memory cell based on the data stored in the fourth latch sets.

* * * * *